(12) United States Patent
Kang

(10) Patent No.: US 9,450,185 B2
(45) Date of Patent: Sep. 20, 2016

(54) THIN-FILM DEPOSITION MASK, METHOD OF FABRICATING THE SAME, AND METHOD OF FABRICATING AN ORGANIC LIGHT EMITTING DISPLAY APPARATUS USING THE SAME

(71) Applicant: Tae-Wook Kang, Yongin (KR)

(72) Inventor: Tae-Wook Kang, Yongin (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 63 days.

(21) Appl. No.: 13/949,415

(22) Filed: Jul. 24, 2013

(65) Prior Publication Data
US 2014/0220715 A1   Aug. 7, 2014

(30) Foreign Application Priority Data
Feb. 1, 2013 (KR) .......... 10-2013-0011982

(51) Int. Cl.
*H01L 51/00* (2006.01)
*C23C 14/04* (2006.01)
*H01L 27/32* (2006.01)

(52) U.S. Cl.
CPC ......... *H01L 51/0011* (2013.01); *C23C 14/042* (2013.01); *H01L 27/3211* (2013.01)

(58) Field of Classification Search
None
See application file for complete search history.

(56) References Cited

U.S. PATENT DOCUMENTS

2007/0023702 A1   2/2007   Yotsuya
2007/0159048 A1 *  7/2007   Chang et al. ............. 313/403

FOREIGN PATENT DOCUMENTS

| JP | 2004-214015 A | 7/2004 |
| KR | 10-2003-0085188 A | 11/2003 |
| KR | 10-2007-0014037 A | 1/2007 |

* cited by examiner

*Primary Examiner* — Mary Wilczewski
*Assistant Examiner* — Erik T Peterson
(74) *Attorney, Agent, or Firm* — Lee & Morse, P.C.

(57) ABSTRACT

A thin-film deposition mask includes a mask body, the mask body having a first surface and a second surface that is an opposite surface of the first surface, the mask body having a plurality of deposition holes therein, and a spacer near the deposition holes, the spacer protruding from the first surface of the mask body in a vertical direction.

18 Claims, 8 Drawing Sheets

THIN-FILM DEPOSITION MASK, METHOD OF FABRICATING THE SAME, AND METHOD OF FABRICATING AN ORGANIC LIGHT EMITTING DISPLAY APPARATUS USING THE SAME

CROSS-REFERENCE TO RELATED APPLICATION

This application claims the benefit of and priority under 35 U.S.C. §119 to Korean Patent Application No. 10-2013-0011982, filed on Feb. 1, 2013, in the Korean Intellectual Property Office, and entitled: "THIN-FILM DEPOSITION MASK, METHOD OF FABRICATING THE SAME, AND METHOD OF FABRICATING AN ORGANIC LIGHT EMITTING DISPLAY APPARATUS USING THE SAME," which is incorporated by reference herein in its entirety.

BACKGROUND

1. Field

Embodiments relate to a thin-film deposition mask, a method of fabricating the same, and a method of fabricating an organic light-emitting display apparatus using the same.

2. Description of the Related Art

An organic light-emitting display apparatus, which may include a thin-film transistor (TFT), may be used as a display apparatus in mobile devices such as digital cameras, video cameras, camcorders, mobile information terminals, or smartphones, or electronic devices such as an ultra-thin television, an ultra-slim notebook, a tablet personal computer (PC), or a flexible display apparatus.

SUMMARY

Embodiments are directed to a thin-film deposition mask, including a mask body, the mask body having a first surface and a second surface that is an opposite surface of the first surface, the mask body having a plurality of deposition holes therein, and a spacer near the deposition holes, the spacer protruding from the first surface of the mask body in a vertical direction.

The deposition holes may be formed in an area of the mask body that corresponds vertically to a plurality of sub-pixels disposed on a substrate on which a deposition material is deposited.

The first surface of the mask body may face the substrate, and the spacer may protrude toward the substrate.

The spacer may include one or more of a discontinuous linear bar, an inclined bar, a curved bar, or an oval bar. The spacer may be located near a sub-pixel.

The spacer may be a continuous linear bar. The spacer may be located along an edge of a sub-pixel.

The spacer may have a height of 1 to 10 micrometers.

The spacer may be formed as one body with the mask body.

The mask may be formed of an Invar material.

Embodiments are also directed to a method of fabricating a thin-film deposition mask, the method including preparing a mask body, the mask body having a first surface that faces a substrate on which a deposition material is deposited, and a second surface that is an opposite surface to the first surface, forming a first photoresist pattern on the mask body, forming a spacer by firstly etching the mask body, forming a second photoresist pattern on the mask body, and forming a plurality of deposition holes by secondly etching the mask body.

The forming of the first photoresist pattern may include selectively forming a first pattern layer in an area in which the spacer is to be formed on the first surface of the mask body, and forming a second pattern layer on the entire second surface of the mask body.

The spacer may protrude from the first surface of the mask body as one body towards the substrate.

The spacer may be formed to have a height of 1 to 10 micrometers.

The forming of the second photoresist pattern may include selectively forming a third pattern layer, which covers the spacer, on the first surface of the mask body, and forming a fourth pattern layer on the second surface of the mask body, and an opening may be formed on the first surface of the mask body, except for an area in which the third pattern layer is formed, and an opening may be formed on the second surface of the mask body, except for an area in which the fourth pattern layer is formed, the openings being located in an area where the openings correspond to each other in a vertical direction of the mask body.

A plurality of the openings may be formed in an area that corresponds to a plurality of sub-pixels disposed on the substrate on which the deposition material is deposited, in a vertical direction of the mask body.

Embodiments are also directed to a method of fabricating an organic light-emitting display apparatus, the method including forming a first electrode on a substrate, forming an insulating layer, which covers an edge of the first electrode, on the first substrate, aligning a mask, from which a plurality of spacers protrude, on the substrate, and contacting the spacer on the insulating layer, forming an organic emissive layer on the first electrode, the forming of the organic emissive layer including passing an organic emissive layer organic emissive layer material through a deposition hole in the mask, forming a second electrode on the organic emissive layer, and forming a sealing layer on the second electrode.

The spacer may be located on the insulating layer along an edge of a sub-pixel in which the organic emissive layer is formed.

The spacer may be located between adjacent sub-pixels.

The spacer may be selectively located at a point where a plurality of sub-pixels cross each other.

A spacer may be located at every point where at least two sub-pixels, which are arranged in a first or a second direction of the substrate, cross each other.

A spacer may be located at a point between sub-pixels, which are arranged in a first or a second direction of the substrate, in a zigzag pattern.

BRIEF DESCRIPTION OF THE DRAWINGS

The above and other features and advantages will become more apparent by describing in detail example embodiments thereof with reference to the attached drawings in which.

DETAILED DESCRIPTION

Figure 1:
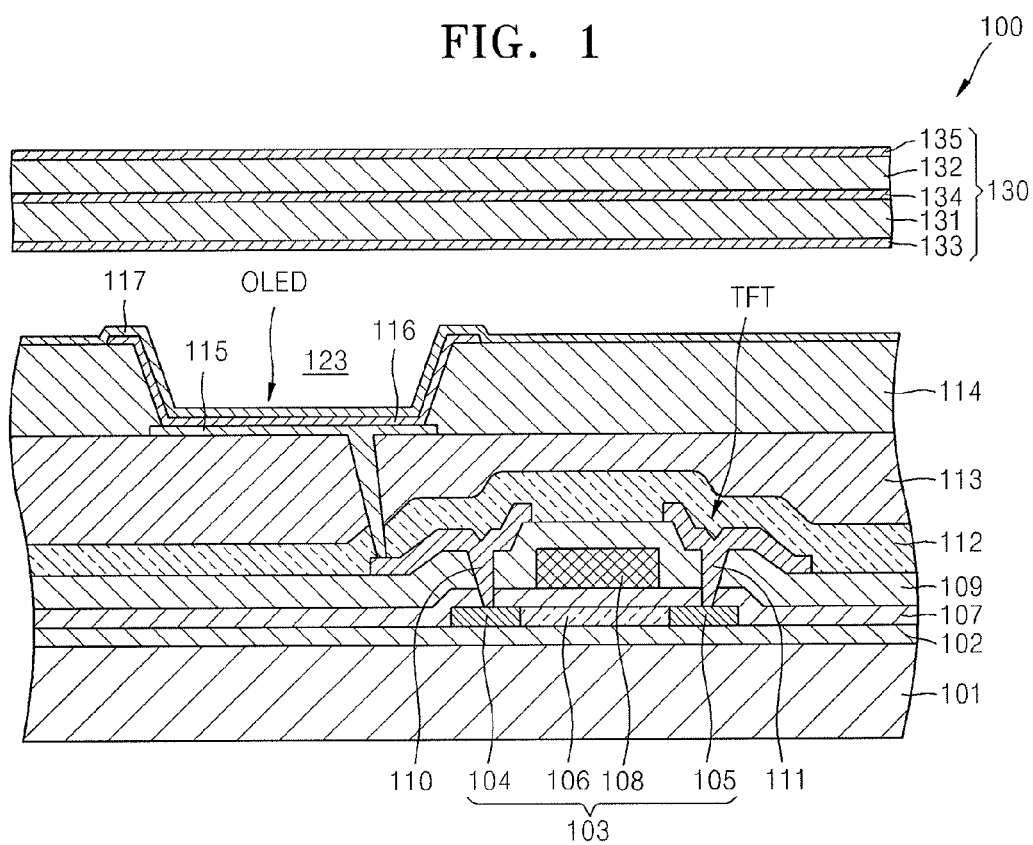
FIG. 1 is a cross-sectional view of a sub-pixel of an organic light-emitting display apparatus, according to an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

While such terms as "first," "second," etc., may be used to describe various components, such components are not limited by the above terms. The above terms are used only to distinguish one component from another.

Terms used in the present specification are merely used to describe particular embodiments, and are not intended to be limiting thereof. An expression used in the singular encompasses the expression of the plural, unless it has a clearly different meaning in the context. In the present specification, it is to be understood that terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

Hereinafter, example embodiments of a thin-film deposition mask, a method of fabricating the same, and a method of fabricating an organic light-emitting display apparatus using the same will be explained with reference to the attached drawings. Like reference numerals in the drawings denote like elements, and thus their description will not be repeated.

Figure 2:
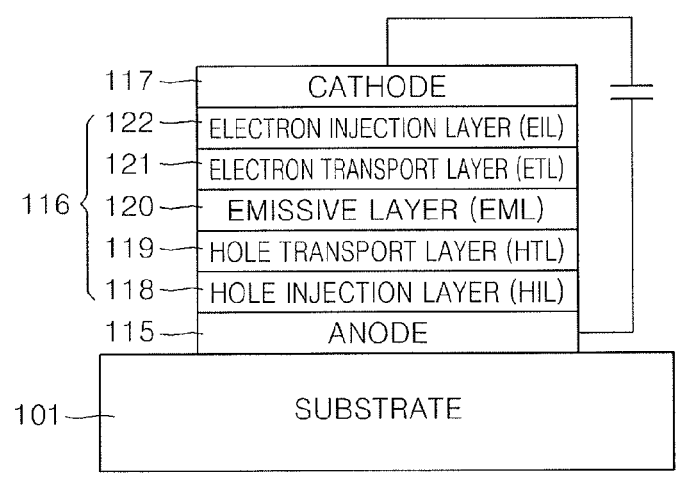
FIG. 2 is a configuration map illustrating an organic light-emitting diode (OLED) of FIG. 1.

FIG. 1 is a cross-sectional view of a sub-pixel of an organic light-emitting display apparatus 100, according to an example embodiment. FIG. 2 illustrates an organic light-emitting diode (OLED) shown in FIG. 1.

The sub-pixels, described herein, include at least one thin-film transistor (TFT) and OLED. The TFT is not limited to a structure shown in FIG. 1, and the number and a structure of the TFT may be variably modified.

In the example embodiment shown in FIGS. 1 and 2, the organic light-emitting display apparatus 100 includes a substrate 101. The substrate 101 may be an insulating substrate that is formed of a material such as glass or plastic.

A buffer layer 102 is formed on the first substrate 101. The buffer layer 102 has a structure formed by using an organic layer or an inorganic layer, or by alternately stacking an organic layer and an inorganic layer. The buffer layer 102 prevents oxygen or moisture from penetrating into the OLED.

A semiconductor active layer 103, which has a predetermined pattern, is formed on the buffer layer 102. The semiconductor active layer 103 may be formed of polycrystalline silicon, but is not limited thereto. The semiconductor active layer 103 may also be formed of an oxide semiconductor.

For example, the oxide semiconductor may include a metal element in Groups 12 through 14 such as zinc (Zn), indium (In), gallium (Ga), tin (Sn), cadmium (Cd), germanium (Ge), or hafnium (Hf), or an oxide of a material selected from a combination thereof. For example, the semiconductor active layer 103 may include G-I—Z—O [$In_2O_3$)a($Ga_2O_3$)$_b$(ZnO)c], where a, b, and c are real numbers, and a≥0, b≥0, and c≥0. The semiconductor active layer 103 is doped with an n-type or p-type impurity ion, and thus, a source area 104 and a drain area 105 are formed on the semiconductor active layer 103. A channel area 106, in which an impurity is not doped, is formed between the source area 104 and the drain area 105.

A gate insulating layer 107 is formed on the semiconductor active layer 103. The gate insulating layer 107 is formed of a single layer which includes silicon dioxide ($SiO_2$) or a double layer which includes $SiO_2$ and silicon nitride ($SiN_x$).

A gate electrode 108 is formed on a predetermined area of the gate insulating layer 107. The gate electrode 108 is connected a gate line (not illustrated) which applies an ON or OFF signal to the TFT. The gate electrode 108 may employ a metal or a metal alloy. The gate electrode 108 may be formed of a single layer that includes molybdenum (Mo), molybdenum tungsten (MoW), chromium (Cr), an aluminum (Al) alloy, magnesium (Mg), nickel (Ni), tungsten (W), gold (Au), or a multiple layer including a combination thereof.

An interlayer insulating layer 109 is formed on the gate electrode 107. A source electrode 110 is electrically connected to the source area 104 via a contact hole that is formed by removing a part of the interlayer insulating layer 109. A drain electrode 111 is electrically connected to the drain area 105 via the contact hole. The interlayer insulating layer 109 may be formed of an insulating material such as $SiO_2$ and $SiN_x$. The interlayer insulating layer 109 may also be formed of an insulating organic material.

A passivation layer 112 that includes $SiO_2$ or $SiN_x$ is formed on the source electrode 110 and the drain electrode 111. The passivation layer 112 may only be formed of an organic material. A planarization layer 113, which includes an organic material such as acryl, polyimide, or benzocyclobutene (BCB), is formed on the passivation layer 112.

A first electrode 115 of the OLED, electrically connected to either of the source electrode 110 or the drain electrode 111 via a contact hole that is formed by removing a part of the planarization layer 113, is formed on the planarization layer 113.

The first electrode 115 functions as an anode from among electrodes included on the OLED, and may be formed of various materials. The first electrode 115 may be formed of a transparent electrode or a reflective electrode, according to characteristics of the OLED.

If the first electrode 115 is formed of a transparent electrode, the first electrode 115 may include indium tin oxide (ITO), indium zinc oxide (IZO), zinc oxide (ZnO), or indium oxide ($In_2O_3$). When the first electrode 115 is used as a reflective electrode, the first electrode 115 may be formed by forming a reflective layer using silver (Ag), Mg, Al, platinum (Pt), palladium (Pd), Au, Ni, neodymium (Nd), iridium (Ir), chromium (Cr), and a compound thereof, and then, forming ITO, IZO, ZnO, or $In_2O_3$ on the reflective layer.

An opening 123 is formed on the planarization layer 113 so as to expose at least a part of the first electrode 115 to the outside. A pixel-defining layer (PDL) 114, which covers an edge of the first electrode 115, is formed around the opening 123. The PDL 114 is an insulating layer, and defines a light-emitting area of each sub-pixel by surrounding the edge of the first electrode 115.

The PDL 114 is formed of an organic or inorganic material. For example, the PDL 114 may be formed of an organic material such as polyimide, polyamide, benzocyclobutene (BCB), acrylic resin, or phenol resin, or an inorganic material such as SiNx. The PDL 114 may be formed of a single or multiple layer, and may be variably modified.

Referring to FIG. 2, an organic layer 116 is formed on the first electrode 115 that is exposed to the outside through the opening 123. The organic layer 116 may be formed by using a deposition process.

In the current example embodiment, the organic layer 116 is illustrated to be formed only on an area where the first electrode 115 of each sub-pixel is patterned. However, the illustration is only for convenience of description, so as to describe an example configuration of the sub-pixel. The organic layer 116 may also be formed as one body with another adjacent sub-pixel. Additionally, from among the organic layers 116, some layers may be formed for each sub-pixel, and other layers may be formed as one body with the organic layer 116 of an adjacent sub-pixel. As such, the organic layer 116 may be variously modified.

The organic layer 116 may be formed of a low-molecular weight organic material or a polymer organic material.

As illustrated in FIG. 2, when the organic layer 116 is formed of a low-molecular weight organic material, a hole injection layer (HIL) 118 and a hole transport layer (HTL) 119, an emissive layer (EML) 120, an electron transport layer (ETL) 121, and an electron injection layer (EIL) 122 may form a single or a multiple layer from a surface of the first electrode 115.

Various organic materials that may be used for the organic layer 116 include copper phthalocyanine (CuPc), N,N'-di (naphthalene-1-yl)-N,N'-diphenyl-benzidine (NPB), tris-8-hydroxyquinoline aluminum (Alq3), and the like. The low-molecular weight organic layer may be formed by using a vacuum deposition method.

When the organic layer 116 is formed of a polymer organic material, the organic layer 116 may include the HTL 119 and the EML 120. The HTL 119 may employ poly-(2, 4)-ethylene-dihydroxy thiophene (PEDOT), and the EML 120 may employ a polymer organic material such as polyphenylene vinylene (PPV), polyfluorene, or the like. The organic layer 116 may be formed by using a screen printing method or an inkjet printing method.

Referring back to FIG. 1, a second electrode 117 is formed on the organic layer 116. Like the first electrode 115, the second electrode 117 may be formed of a transparent electrode or a reflective electrode.

When the second electrode 117 is formed of a transparent electrode, a metal with a low work function, for example, lithium (Li), calcium (Ca), lithium-fluoride-calcium (LiF/Ca), lithium-fluoride-aluminum (LiF/Al), Al, Mg, or a compound thereof is deposited on the organic layer 116, and then, an auxiliary electrode, which includes a material for forming a transparent electrode such as ITO, IZO, ZnO, In$_2$O$_3$, may be formed thereon.

When the second electrode 117 is formed of a reflective electrode, the second electrode 117 may be formed on the entire display area of the organic light-emitting display apparatus 100 by depositing Li, Ca, LiF/Ca, LiF/Al, Al, Ag, Mg, or a compound thereof on the entire display area of the organic light-emitting display apparatus 100.

When the first electrode 115 is formed of a transparent electrode or a reflective electrode, the first electrode 115 is formed only on the opening 123 of each sub-pixel. In another implementation, the second electrode 117 may be formed by depositing a transparent electrode or a reflective electrode on an entire display area of the organic light-emitting display apparatus 100. In another implementation, the second electrode 117 may not be deposited on the entire substrate 101, and the second electrode 117 may be formed to have various patterns. Additionally, the first electrode 115 and the second electrode 117 may be stacked in opposite positions to each other.

As such, the OLED includes the first electrode 115, the second electrode 117, and the organic layer 116 that includes an organic emissive layer interposed between the first electrode 115 and the second electrode 117. The first electrode 115 and the second electrode 117 are insulated from each other by the organic layer 116. As voltages with different polarities are applied to the organic layer 116, the organic layer 116 emits light.

An encapsulation layer 130 is formed on the second electrode 117. The encapsulation layer 130 includes a structure in which at least one organic layer and at least one inorganic layer are respectively stacked. For example, the encapsulation layer 130 has a structure in which at least one or more organic layers 131 and 132, formed of a material such as epoxy, polyimide, polyethylene terephthalate, polycarbonate, polyethylene, polyacrylate, and at least one or more inorganic layers 133 through 135, formed of a material such as SiO$_2$, SiN$_x$, aluminum oxide (Al$_2$O$_3$), titanium oxide (TiO$_2$), zirconium oxide (ZrOx), or zinc oxide (ZnO), are stacked. The encapsulation layer 130 may have a structure in which at least one or more organic layers 131 and 132 and at least two or more inorganic layers 133 through 135 are stacked.

As described above, a material of the organic layer 116, included in the OLED, is deposited by using a mask. If the mask directly contacts the substrate, the mask may cause damage, such as a scratch inside a sub-pixel.

Generally, in order to prevent such damage inside a sub-pixel, a spacer could be additionally formed on the PDL 114. Then, by aligning a mask on the spacer, a space between the mask and the OLED is maintained.

However, in order to align the mask on the spacer, the spacer may be formed to have a height of about 1.5 through 3.0 micrometers. Thus, a space between the mask and the OLED may be maintained. If the encapsulation layer 130 is formed on the OLED to have a structure in which the organic layers 131 and 132 and the inorganic layers 133 through 135 are stacked, a thickness of the organic layers 131 and 132, for sufficiently covering the spacer, may increase in proportion to a thickness of the encapsulation layer 130. Accordingly, a processing time for forming the encapsulation layer 130 may increase, pollution in a chamber may increase, and thus, a chamber cleaning cycle may be shortened.

According to an example embodiment, in order to maintain a space between the mask and the OLED, a spacer for maintaining such a space is formed on the mask.

A detailed description of this forming of the space will be given below.

Figure 3:
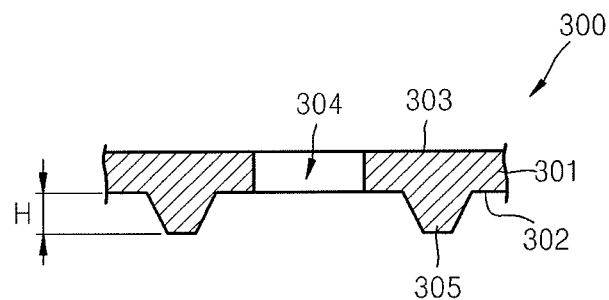
FIG. 3 is a partially-sectioned cross-sectional view illustrating a deposition mask, according to an example embodiment.

FIG. 3 is a partially-sectioned cross-sectional view illustrating a deposition mask 300, according to an example embodiment.

In the example embodiment shown in FIG. 3, the deposition mask 300 includes a mask body 301. The mask body 301 is a thin-type metal plate. For example, the mask body 301 includes a stainless steel alloy, an aluminum-killed steel alloy, or an iron-nickel (Fe–Ni) Invar alloy. The mask body 301 may include an Invar alloy, due to its excellent weldability. The mask body 301 includes a first surface 302, which faces the OLED shown in FIG. 1, and a second surface 303, which is an opposite side to the first surface 302.

A plurality of deposition holes 304 are formed on the mask body 301. The deposition holes 304 are formed to pass through the mask body 301 from the first surface 302 to the second surface 303 of the mask body 301. Through the deposition hole 304, a deposition material may be deposited on a desired area of the organic light-emitting display apparatus 100, shown in FIG. 1. In the current example embodiment, the deposition material corresponds to a material of the organic emissive layer included in the OLED.

The mask body 301 includes a space control element for maintaining a space between a deposition mask 300 for a deposition process and the OLED. Thus, the deposition mask 300 includes a spacer 305.

The spacer 305 protrudes from the first surface 302 of the mask body 301 towards the OLED in a vertical direction. In the current example embodiment, the spacer 305 is formed as one body with the mask body 301. However, the spacer 305 protruding from the first surface 302 of the mask body 301 is not limited to one structure.

A height H of the spacer 305 ranges from 1 to 10 micrometers. If the height of the spacer is less than 1 micrometer, an effective space between the deposition mask 300 and the OLED may not be maintained. Accordingly, in a process of deposition, a thin-film layer, formed on the substrate 101 shown in FIG. 1, may be damaged. If the height of the spacer is greater than 10 micrometers, a shadow may occur. Thus, a deposition material may intrude to an adjacent sub-pixel with a different color.

A process of fabricating the deposition mask, which includes the above structure, will now be described below.

FIGS. 4A through 4D are diagrams sequentially illustrating stages in a process of fabricating the deposition mask, according to an example embodiment.

Figure 4A:
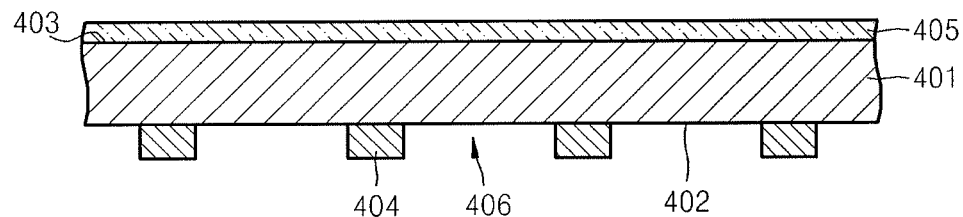
FIGS. 4A through 4D are diagrams illustrating stages in a process of fabricating the deposition mask, according to an example embodiment.
Figure 4B:
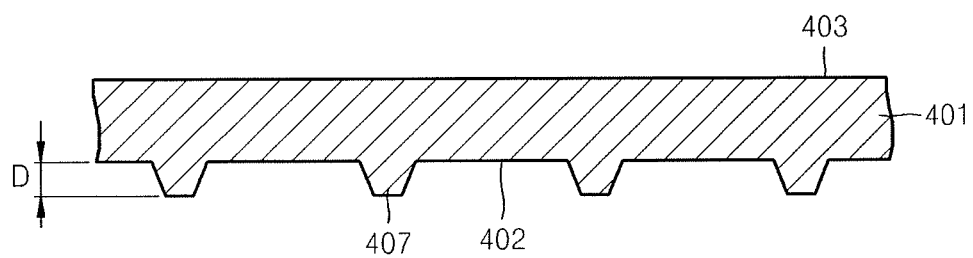
Figure 4C:
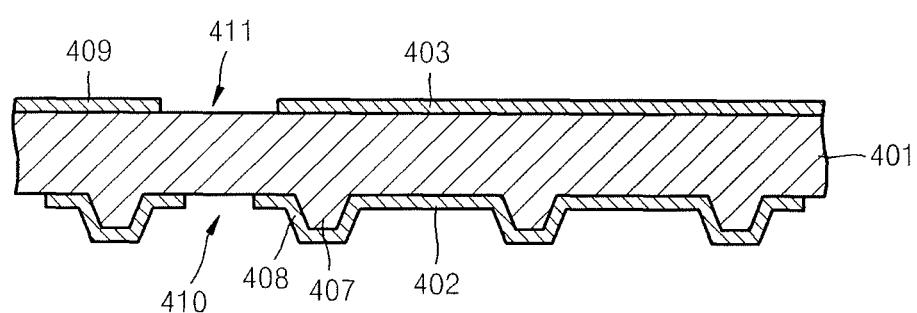
Figure 4D:
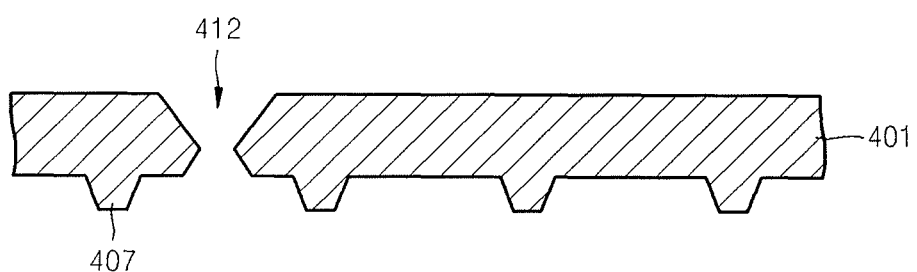

FIG. 4A is a cross-sectional view illustrating a status of a deposition mask body, after a first photoresist pattern layer is formed on both sides of the deposition mask body, according to an example embodiment; FIG. 4B is a cross-sectional view illustrating a status of the deposition mask body, after a spacer is formed on the deposition mask body of FIG. 4A; FIG. 4C is a cross-sectional view illustrating a status of the deposition mask body, after a second photoresist pattern layer is formed on the deposition mask body of FIG. 4B; FIG. 4D is a cross-sectional view illustrating a status of the deposition mask body, after a deposition hole is formed on the deposition mask body of FIG. 4C.

As illustrated in FIG. 4A, a mask body 401, which is formed of a thin-type metal plate, is prepared. A first photoresist pattern is formed on a first surface 402 of the mask body 401, and on a second surface 403 that is in an opposite side to the first surface 402.

A first pattern layer 404 is selectively formed on the first surface 402. The first surface 402 is a surface which faces the OLED in a deposition process. An area in which the first pattern layer 404 is formed corresponds to an area in which a spacer is formed. An opening 406 is an area in which the first pattern layer 404 is not formed.

A second pattern layer 405 is formed on the second surface 403, so as to cover the entire mask body 401.

Then, as illustrated in FIG. 4B, the mask body 401 is firstly etched. When the mask body 401 is firstly etched, a predetermined thickness D of an area of the first surface 402 of the mask body 401, except for an area in which the first pattern layer 404 is formed, is removed. The thickness D of the etched mask body 401 corresponds to a height of a spacer 407 which protrudes from the first surface 402 of the mask body 401.

The second surface 403 of the mask body 401 is entirely covered by the second pattern layer 405. Thus, the second surface 403 is not etched.

Then, when the first pattern layer 404 and the second pattern layer 405 are stripped, a plurality of the spacers 407 protrude from the first surface 402 of the mask body 401. A height of the spacer 305 ranges from 1 to 10 micrometers.

Then, as illustrated in FIG. 4C, a second photoresist pattern is formed on the first surface 402 of the mask body 401, and on the second surface 403 that is an opposite side to the first surface 402.

A third pattern layer 408 that covers the spacer 407 is selectively formed on the first surface 402. An opening 410 is an area in which the third pattern layer 408 is not formed. A fourth pattern layer 409 is selectively formed on the second surface 403. An opening 411 is an area in which the fourth pattern layer 409 is not formed.

The opening 410 formed on the first surface 402 and the opening 411 formed on the second surface 403 are located in an area which corresponds to each other in a vertical direction of the mask body 401. Then, a deposition hole 412 is formed in an area which provides a path in which a deposition material is deposited. Additionally, a plurality of the openings 410 and 411 is formed in an area which, in a vertical direction of the mask body 401, corresponds to a plurality of sub-pixels disposed on the substrate 101 of FIG. 1 in which the deposition material is deposited.

Then, as illustrated in FIG. 4D, the mask body 401 is secondly etched. The mask body 401 is secondly etched along the openings 410 and 411 which are not covered by the third pattern layer 408 and the fourth pattern layer 409. Thus, the deposition hole 412 is formed. The deposition hole 412 may be formed of various shapes such as a dot-shaped slit or a strip-shaped slit.

Then, the third pattern layer 408 and the fourth pattern layer 409 are removed.

Through the process described above, the spacer 407 is formed on the mask body 401 so as to maintain a space between the OLED and the mask. Additionally, the deposition hole 412 for providing a path, through which a deposition material for depositing an organic emissive layer of the OLED passes, is formed.

In the current example embodiment, as an example, after the spacer 407 is formed on the mask body 401, the deposition hole 412 is formed. However, the process of forming the deposition 412 and the spacer 407 is not limited thereto, and the spacer 407 may be formed after the deposition hole 412 is formed on the mask body 401. In the current example embodiment, in consideration of a fabrication process, the spacer 407 may be formed on the mask body 401 and then the deposition hole 412 may be formed.

FIGS. 5A through 5D are diagrams sequentially illustrating stages in a process of fabricating the organic light-emitting display apparatus 100, according to an example embodiment.

Figure 5A:
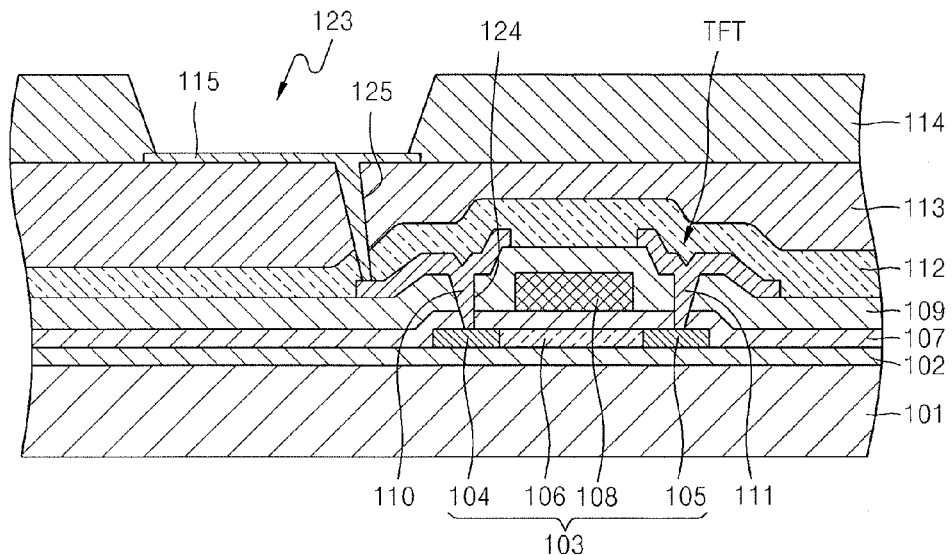
FIGS. 5A through 5D are diagrams sequentially illustrating stages in a process of fabricating the organic light-emitting display apparatus, according to an example embodiment.
Figure 5B:
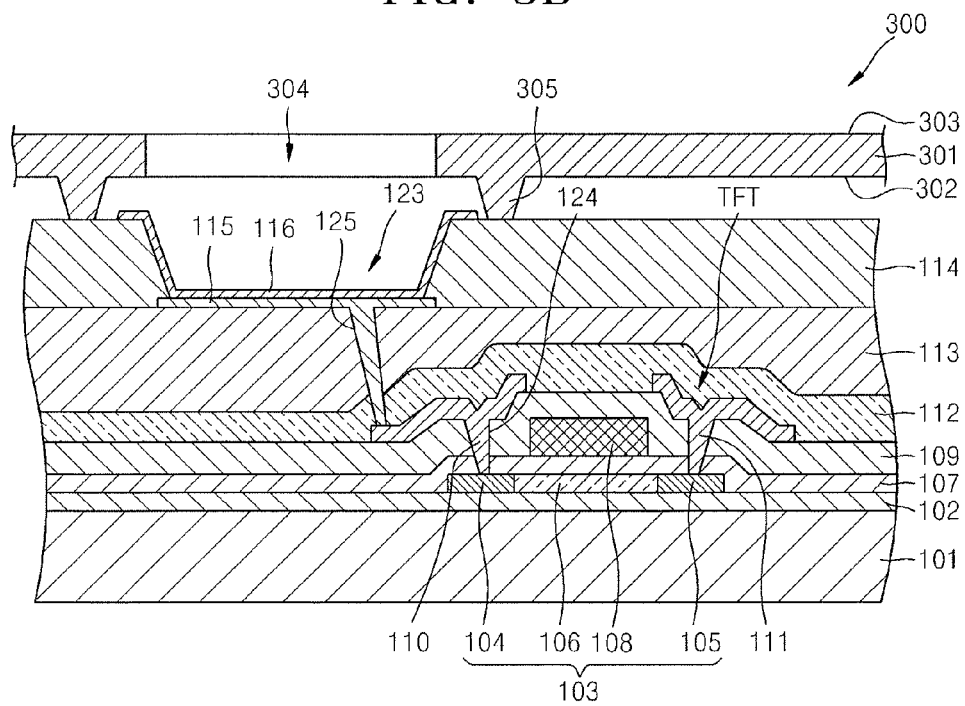
Figure 5C:
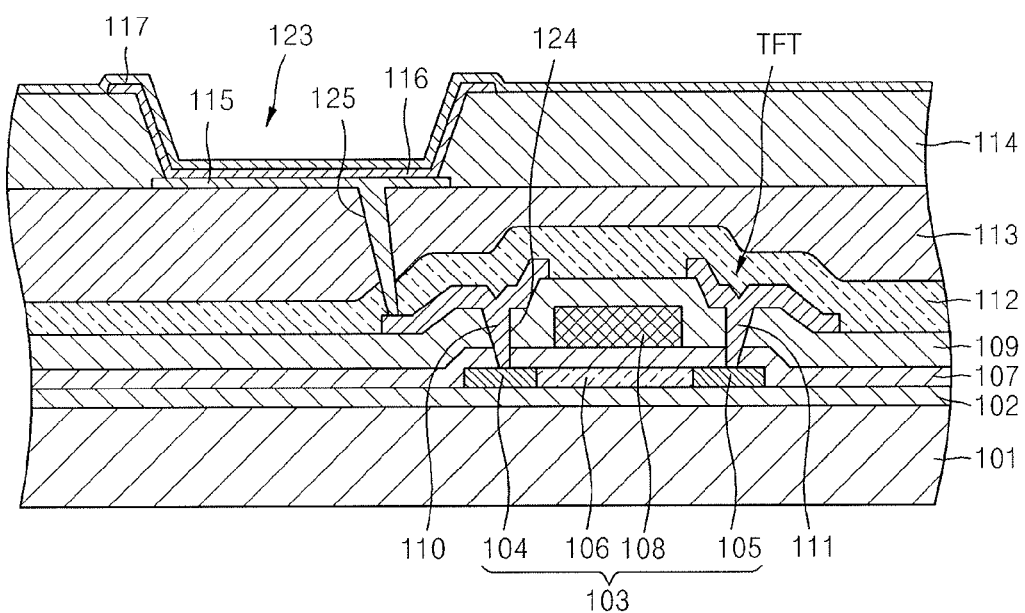
Figure 5D:
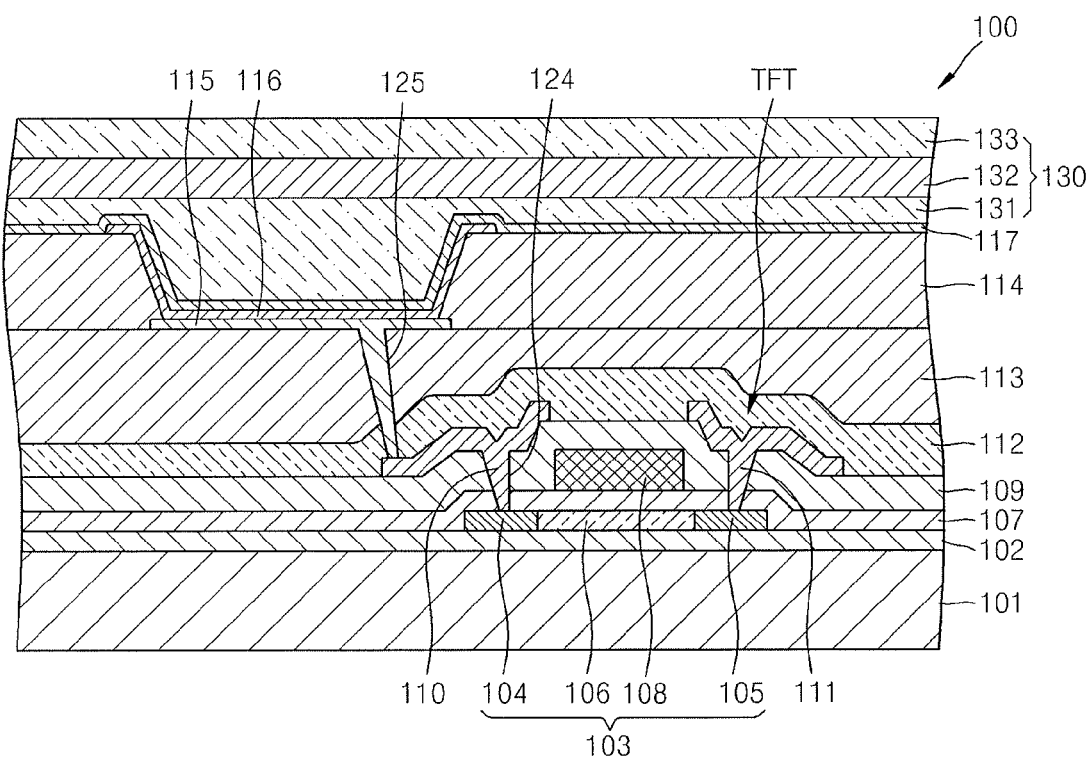

FIG. 5A is a cross-sectional view illustrating a status of a substrate, after a first electrode and a pixel-defining layer (PDL) are formed on the substrate, according to an example embodiment; FIG. 5B is a cross-sectional view illustrating a status of the substrate, after the deposition mask is aligned on the substrate of FIG. 5A; FIG. 5C is a cross-sectional view illustrating a status of the substrate, after an organic emission layer and a second electrode are formed on the substrate of FIG. 5B, according to an example embodiment; FIG. 5D is a cross-sectional view illustrating a status of the substrate, after a thin-film encapsulation layer is formed on the substrate of FIG. 5C.

As illustrated in FIG. 5A, the buffer layer 102 is formed on the first substrate 101. The semiconductor active layer 103 is formed on the buffer layer 102. The gate insulating layer 107 is deposited on the semiconductor active layer 103. The gate electrode 108 is formed on the gate insulating layer 107.

The semiconductor active layer 103 is doped with an n-type or p-type impurity ion by using the gate electrode 107 as a mask so that the source area 104 and the drain area 105 are formed on the semiconductor active layer 103. An area between the source area 104 and the drain area 105 is the channel area 106, in which an impurity is not doped.

The interlayer insulating layer 109 is formed on the gate electrode 107. A contact hole 124 is formed by etching and selectively removing the gate insulating layer 107 and the interlayer insulating layer 109. As the contact hole 124 is formed, a partial surface of the source area 104 and the drain area 105 is exposed.

The source electrode 110, electrically connected to the source area 104, and the drain electrode 111, electrically connected to the drain area 105, are formed via the contact hole 124. The passivation layer 112 is deposited on the source electrode 110 and the drain electrode 111.

The planarization layer 113 is formed on the passivation layer 112.

Through the process described above, a TFT is formed on the substrate 101.

Then, a contact hole 125 is formed by etching and selectively removing the passivation layer 112 and the planarization layer 113. As the contact hole 125 is formed, a partial surface of either the source electrode 110 or the drain electrode 111 is exposed.

Via the contact hole 125, either the source electrode 110 or the drain electrode 111 is connected to the first electrode 114 that is an anode electrode.

Then, the opening 123 is formed on the planarization layer 113 so as to expose at least a part of the first electrode 115 to the outside. The PDL 114, which covers an edge of the first electrode 115, is formed around the opening 123.

Then, as illustrated in FIG. 5B, the deposition mask 300 is aligned on the substrate 101. In the deposition mask 300, the spacer 305 protrudes from the first surface 302 of the mask body 301, which faces the substrate 101, towards the substrate 101 in a vertical direction. A lower part of the spacer 305 directly contacts the PDL 114 along an edge of a sub-pixel. A height of the spacer 305 ranges from 1 to 10 micrometers. The deposition hole 304 formed on the deposition mask 301 is located in a vertical direction at an area which corresponds to the sub-pixel.

Then, a material of the organic emissive layer is deposited on the first electrode 115, formed on the sub-pixel, via the deposition hole 304 that is formed on the deposition mask 301. Accordingly, the organic layer 116 may be deposited on the first electrode 115. A space between the deposition mask 300 and the substrate 101 is maintained by the spacer 305. Thus, damage to a thin-film layer on the substrate 101, which may be caused by contact with the deposition mask 300, may be prevented in advance.

Then, as illustrated in FIG. 5C, the second electrode 117, which is a cathode, is deposited on the entire substrate 101, so as to cover the organic layer 116.

Then, as illustrated in FIG. 5D, the thin-film encapsulation layer 130 is formed on the substrate 101. The encapsulation layer 130 is formed by stacking at least one or more organic layers 131 and 133 and at least one or more inorganic layers 132, so as to prevent moisture from penetrating into the OLED.

Through the process described above, a TFT and an OLED may be fabricated on the substrate 101.

Figure 6:
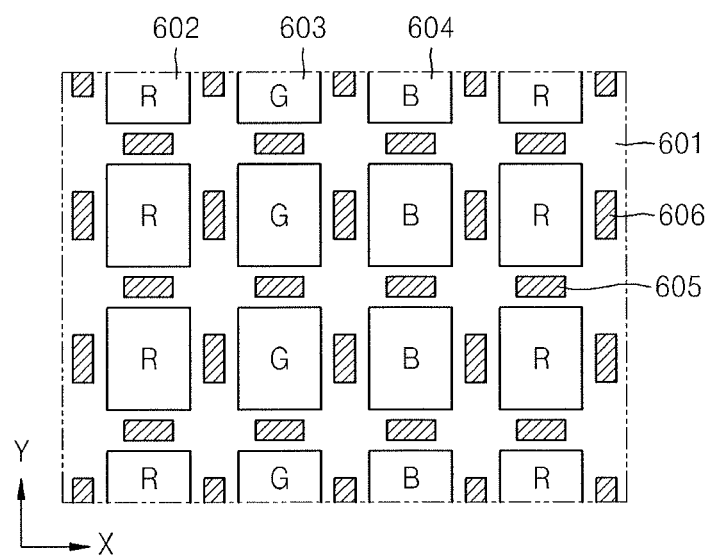
FIG. 6 is a plan view illustrating a location of a spacer on the substrate, according to an example embodiment.
Figure 7:
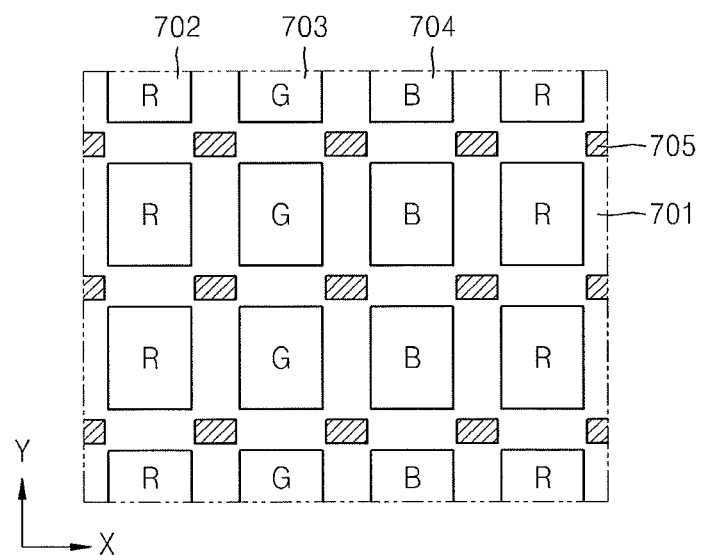
FIG. 7 is a plan view illustrating a location of a spacer on the substrate, according to another example embodiment.
Figure 8:
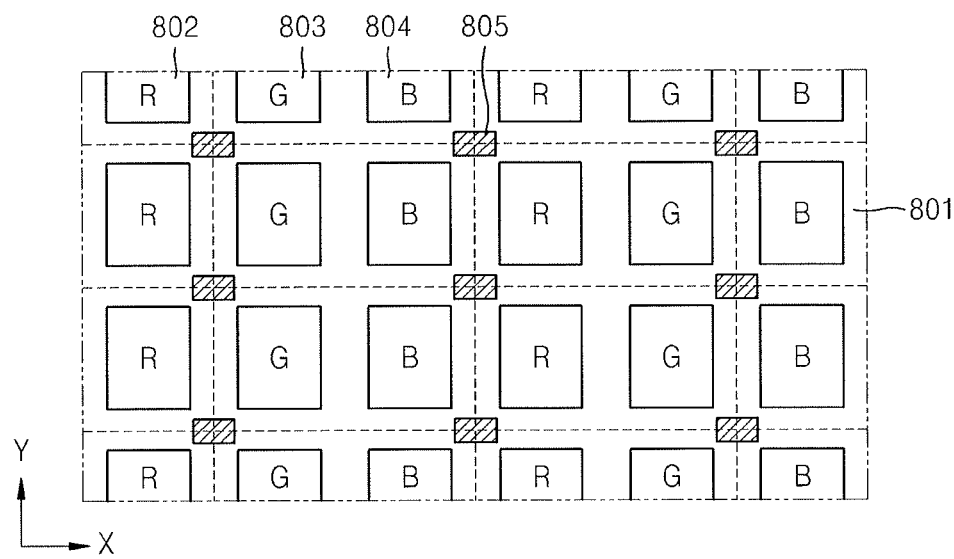
FIG. 8 is a plan view illustrating a location of a spacer on the substrate, according to another example embodiment.

FIGS. 6 through 8 illustrate a location of a spacer which protrudes from a deposition mask on a substrate, according to an example embodiment.

Referring to FIG. 6, sub-pixels 602 through 604 are formed on a substrate 601.

The respective sub-pixels 602 through 604 are sub-pixels which respectively include an organic emissive layer in a color such as red, green, or blue. In the current example embodiment, the sub-pixels 602 through 604 respectively have a rectangular shape. However, the sub-pixels 602 through 604 may also be patterned to have various shapes such as a polygon, a circle, or an oval.

A first spacer 605 and a second spacer 606, which protrude from the deposition mask as one body, are located between the sub-pixels 602 through 604. That is, the first spacer 605 is located along an X direction between the red, green, and blue sub-pixels 602 through 604 which are adjacently disposed in a Y direction. The second spacer 606 is located along a Y direction between the red, green, and blue sub-pixels 602 through 604 which are adjacently disposed in an X direction.

In the current example embodiment, the first spacer 605 and the second spacer 606 have a shape of a linear bar which protrudes from the deposition mask. However, the first spacer 605 and the second spacer 606 may have various shapes such as an inclined bar, a curved bar, or an oval bar.

Additionally, the first spacer 605 and the second spacer 606 are located at a center of a sub-pixel between the adjacent sub-pixels 602 and 603. However, a location thereof is not limited thereto. For example, the first spacer 605 and the second spacer 606 may be discontinuously located along an edge of the respective sub-pixels 602 through 604. Also, the first spacer 605 and the second spacer 606 may be located along an edge of the respective sub-pixels 602 through 604 along a continuous line. The first spacer 605 and the second spacer 606 may be formed to have a discontinuous shape, so as to reduce an area in which the first and second spacers 605 and 606 contact the substrate 601.

Referring to FIG. 7, sub-pixels 702 through 704 are formed on a substrate 701. A spacer 705, which protrudes from the deposition mask as one body, is located at every point where a plurality of sub-pixels 702 through 704, which are disposed in X and Y directions of the substrate 701, cross each other. As will be apparent to one of ordinary skill in the art from this description and drawings, regions or lanes between sub-pixels may serve as locations for the spacers 705, and the spacers 705 may be located at intersections of such regions or lanes.

Referring to FIG. 8, sub-pixels 802 through 804 are formed on a substrate 801. A spacer 805, which protrudes from the deposition mask as one body, is located at every point where two adjacent sub-pixels from among the sub-pixels 802 through 804, which are disposed in X and Y directions of the substrate 801, cross each other. Accordingly, the number of spacers 805, formed on the deposition mask, may be reduced. As will be apparent to one of ordinary skill in the art from this description and drawings, regions or lanes between sub-pixels may serve as locations for the spacers 805, and the spacers 805 may be located at alternating intersections of such regions or lanes in one direction.

Figure 9:
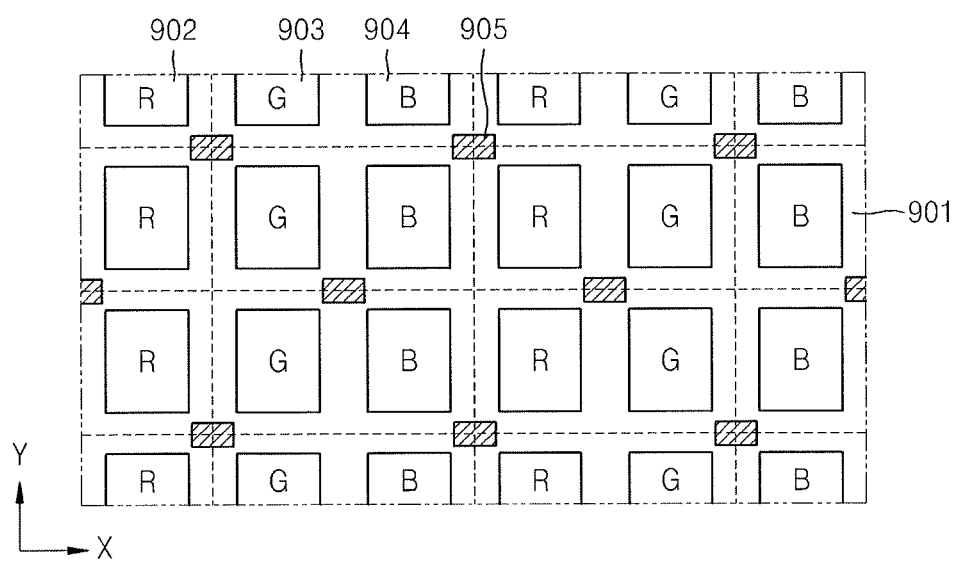
FIG. 9 is a plan view illustrating a location of a spacer on the substrate, according to another example embodiment.

Referring to FIG. 9, sub-pixels 902 through 904 are formed on a substrate 901. A spacer 905, which protrudes from the deposition mask as one body, is located in a zigzag pattern between the plurality of sub-pixels 902 through 904 disposed in X and Y directions of the substrate 901. As will be apparent to one of ordinary skill in the art from this description and drawings, regions or lanes between sub-pixels may serve as locations for the spacers 905, and the spacers 905 may be located at alternating intersections of such regions or lanes in two directions.

As such, in the present example embodiment, a location of the spacers 605 through 905, which protrude from the deposition mask as one body, is not limited to a particular position such as a point between adjacent sub-pixels or a point where adjacent sub-pixels cross each other. The spacers 605 through 905 may be located on an insulating layer near the sub-pixel so as to maintain a space between the deposition mask and the substrate, so that the deposition mask does not cause damage, such as a scratch inside the sub-pixel.

As such, with regard to a thin-film deposition mask, a method of fabricating the same, and a method of fabricating an organic light-emitting display apparatus using the same, a spacer for maintaining a space between a mask and a substrate is formed on a mask, and thus, a thickness of an organic layer included in a thin-film encapsulation layer for covering the OLED may be reduced.

Additionally, even when a thin-film encapsulation is not formed, a thickness of an insulating layer for covering an anode electrode may be reduced. Accordingly, an exposure time of photo equipment may be reduced.

Additionally, a spacer may not be formed on a device substrate. Thus, a process may be simplified, and a cost of a photo mask may also be reduced.

By way of summation and review, an organic light-emitting display apparatus may include a first electrode, a second electrode, and an organic emissive layer interposed between the first electrode and the second electrode. The first and second electrodes and the organic emissive layer may be formed by performing various methods, such as a photolithography method or a deposition method. The photolithography method may be performed by wet etching a partial area of a substrate by coating a photoresist on the partial area of the substrate. However, in a process of stripping a photoresist by using the photolithography method, moisture may penetrate into an organic emissive layer. Accordingly, as time passes, performance and lifespan of an organic light-emitting display apparatus may deteriorate.

With regard to the deposition method, a desired pattern may be patterned by aligning a mask, which has the same pattern as a thin-film layer formed on a substrate, and depositing a material for a deposition layer on the substrate. While an organic emissive layer, included in an organic light-emitting diode (OLED), is deposited, a space is maintained between the pattern and the mask. As described above, embodiments relate to a thin-film deposition mask for easily depositing a thin film on a substrate, a method of fabricating the same, and a method of fabricating an organic light-emitting display apparatus using the same. A spacer for maintaining a space between the mask and a substrate is formed on the mask. Thus, a thickness of an organic layer included in a thin-film encapsulation layer for covering an organic light-emitting diode (OLED) may be reduced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A thin-film deposition mask, comprising:
a mask body, the mask body having a first surface and a second surface that is an opposite surface of the first surface, the mask body having a plurality of deposition holes therein and having spacers protruding from the first surface of the mask body in a vertical direction,
the deposition holes being located in an area of the mask body that corresponds vertically to a plurality of sub-pixels disposed on a substrate that receives a deposition material deposited through the deposition holes, the sub-pixels being separated by first and second lanes that intersect and extend between the sub-pixels at angles to each other in respective first and second directions, the deposition holes having a first dimension in the first direction and a second dimension in the second direction,
the spacers being located to discontinuously contact the substrate along centerlines of the first lanes extending in the first direction and discontinuously contact the substrate along centerlines of the second lanes extending in the second direction, the spacers having respective contact surfaces for contacting the substrate in the lanes, the contact surfaces having a third dimension in the first direction and a fourth dimension in the second direction, the third dimension being smaller than the first dimension, and the fourth dimension being smaller than the second dimension.

2. The thin-film deposition mask of claim 1, wherein:
the first surface of the mask body faces the substrate, and
the spacers protrude toward the substrate.

3. The thin-film deposition mask of claim 1, wherein the spacers include one or more of a discontinuous linear bar, an inclined bar, a curved bar, or an oval bar, the spacer being located near a sub-pixel.

4. The thin-film deposition mask of claim 1, wherein the spacers have a height of 1 to 10 micrometers.

5. The thin-film deposition mask of claim 1, wherein the spacers are formed as one body with the mask body.

6. The thin-film deposition mask of claim 1, wherein the mask is formed of an Invar material.

7. A method of fabricating a thin-film deposition mask, the method comprising:
preparing a mask body, the mask body having a first surface that faces a substrate that receives a deposition material deposited via the thin-film deposition mask, and a second surface that is an opposite surface to the first surface;

forming a first photoresist pattern on the mask body;
forming a plurality of spacers that protrude from the first surface of the mask body in a vertical direction by firstly etching the mask body;
forming a second photoresist pattern on the mask body; and
forming a plurality of deposition holes in the mask body by secondly etching the mask body,
the deposition holes being formed in an area of the mask body that corresponds vertically to a plurality of sub-pixels disposed on the substrate, the sub-pixels being separated by first and second lanes that intersect and extend between the sub-pixels at angles to each other in respective first and second directions, the deposition holes having a first dimension in the first direction and a second dimension in the second direction,
the spacers being located to discontinuously contact the substrate along centerlines of the first lanes extending in the first direction and discontinuously contact the substrate along centerlines of the second lanes extending in the second direction, the spacers having respective contact surfaces for contacting the substrate in the lanes, the contact surfaces having a third dimension in the first direction and a fourth dimension in the second direction, the third dimension being smaller than the first dimension, and the fourth dimension being smaller than the second dimension.

8. The method of claim 7, wherein the forming of the first photoresist pattern includes selectively forming a first pattern layer in an area in which the spacers are to be formed on the first surface of the mask body, and forming a second pattern layer on the entire second surface of the mask body.

9. The method of claim 7, wherein the spacers protrude from the first surface of the mask body as one body towards the substrate.

10. The method of claim 9, wherein the spacers are formed to have a height of 1 to 10 micrometers.

11. The method of claim 7, wherein the forming of the second photoresist pattern includes selectively forming a third pattern layer, which covers the spacers, on the first surface of the mask body, and forming a fourth pattern layer on the second surface of the mask body, and
wherein an opening is formed on the first surface of the mask body, except for an area in which the third pattern layer is formed, and an opening is formed on the second surface of the mask body, except for an area in which the fourth pattern layer is formed, the openings being located in an area where the openings correspond to each other in a vertical direction of the mask body.

12. The method of claim 11, wherein a plurality of the openings is formed in an area that corresponds to the plurality of sub-pixels disposed on the substrate on which the deposition material is deposited, in a vertical direction of the mask body.

13. A method of fabricating an organic light-emitting display apparatus, the method comprising:
forming a first electrode on a substrate;
forming an insulating layer, which covers an edge of the first electrode, on the first substrate;
aligning a mask, from which a plurality of spacers protrude, on the substrate such that the spacers contact the insulating layer,
the mask having a mask body having a first surface and a second surface that is an opposite surface of the first surface, the mask body having a plurality of deposition holes therein, the spacers protruding from a first surface of the mask body in a vertical direction,
the deposition holes being located in an area of the mask body that corresponds vertically to a plurality of sub-pixels disposed on the substrate, the sub-pixels being separated by first and second lanes that intersect and extend between the sub-pixels at angles to each other in respective first and second directions, the deposition holes having a first dimension in the first direction and a second dimension in the second direction,
the spacers being located to discontinuously contact the substrate along centerlines of the first lanes extending in the first direction and discontinuously contact the substrate along centerlines of the second lanes extending in the second direction, the spacers having respective contact surfaces for contacting the substrate in the lanes, the contact surfaces having a third dimension in the first direction and a fourth dimension in the second direction, the third dimension being smaller than the first dimension, and the fourth dimension being smaller than the second dimension;
forming an organic emissive layer on the first electrode, the forming of the organic emissive layer including passing an organic emissive layer organic emissive layer material through the deposition holes in the mask;
forming a second electrode on the organic emissive layer; and
forming a sealing layer on the second electrode.

14. The method of claim 13, wherein the spacers are located on the insulating layer along edges of sub-pixels in which the organic emissive layer is formed.

15. The method of claim 14, wherein the spacers are located between adjacent sub-pixels.

16. The method of claim 14, wherein the spacers are selectively located at a point where a plurality of sub-pixels cross each other.

17. The method of claim 14, wherein a spacer is located at every point where at least two sub-pixels, which are arranged in the first or the second direction of the substrate, cross each other.

18. The method of claim 14, wherein a spacer is located at a point between sub-pixels, which are arranged in the first or the second direction of the substrate, in a zigzag pattern.

* * * * *